United States Patent
Yoon et al.

(10) Patent No.: US 8,526,245 B2
(45) Date of Patent: Sep. 3, 2013

(54) METHOD AND APPARATUS FOR MANAGING OPEN BLOCKS IN NONVOLATILE MEMORY DEVICE

(75) Inventors: Sang Yong Yoon, Seoul (KR); Dong Hyuk Chae, Seoul (KR); Bo Geun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 207 days.

(21) Appl. No.: 13/027,439

(22) Filed: Feb. 15, 2011

(65) Prior Publication Data

US 2011/0205817 A1    Aug. 25, 2011

(30) Foreign Application Priority Data

Feb. 19, 2010   (KR) .................. 10-2010-0015316

(51) Int. Cl.
*G11C 7/00*    (2006.01)

(52) U.S. Cl.
USPC ............ 365/189.16; 365/185.03; 365/185.17; 365/189.011; 365/185.05; 365/185.24

(58) Field of Classification Search
USPC .......... 365/189.16, 185.03, 185.17, 189.011, 365/185.05, 185.24
See application file for complete search history.

(56) References Cited

U.S. PATENT DOCUMENTS

2008/0310224 A1* 12/2008 Roohparvar et al. .... 365/185.03

\* cited by examiner

*Primary Examiner* — Toan Le
*Assistant Examiner* — Hai Pham
(74) *Attorney, Agent, or Firm* — Stanzione & Kim, LLP

(57) ABSTRACT

A memory system comprises a multi-bit memory device and a memory controller that controls the multi-bit memory device. The memory system determines whether a requested program operation is a random program operation or a sequential program operation. Where the requested program operation is a random program operation, the memory controller controls the multi-bit memory device to perform operations according to a fine program close policy or a fine program open policy.

7 Claims, 15 Drawing Sheets

METHOD AND APPARATUS FOR MANAGING OPEN BLOCKS IN NONVOLATILE MEMORY DEVICE

CROSS-REFERENCE TO RELATED APPLICATIONS

This application claims priority under 35 U.S.C. §119 to Korean Patent Application No. 10-2010-0015316 filed on Feb. 19, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to nonvolatile memory devices and techniques for managing open blocks in nonvolatile memory devices.

Semiconductor memory devices play a significant role in a wide variety of consumer and industrial technologies ranging from home computers to satellite equipment. Consequently, improvements in semiconductor memory technology can have a significant impact on the performance of numerous technical applications.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include read only memory (ROM), ferroelectric random access memory (FRAM), phase-change random access memory (PRAM), and flash memory.

Flash memory has achieved widespread popularity in recent years due to its attractive cost, performance, storage capacity, and durability. As the demand for flash memory has continued to grow, researchers have made continual improvements to flash memory devices. Among these improvements is the development of flash memory devices that can store multiple bits of data per memory cell. However, as the number of bits per memory cell increases, it becomes more difficult to ensure the reliability of stored data.

SUMMARY OF THE INVENTION

Embodiments of the inventive concept provide memory systems and methods that can improve the reliability of multi-bit memory devices.

According to one embodiment of the inventive concept, a method is provided for operating a memory system comprising a multi-bit memory device. The method comprises determining whether a requested program operation is a random program operation. Where the requested program operation is determined to be a random program operation, the method determines whether a selected memory block of a current program operation is an open block, and upon determining that the selected memory block is an open block, performs a fine program operation on coarse-programmed memory cells in the selected memory block before performing the random program operation. The method also determines whether the requested program operation is an open block program operation. Where the requested program operation is determined to be an open block program operation, the method stores program data of the open block program operation in the selected memory block.

In certain embodiments, the method further comprises, upon determining that the selected memory block is not an open block, performing the random program operation without first performing a fine program operation on the selected memory block.

In certain embodiments, storing the program data of the open block program operation comprises skipping a program operation on a first wordline adjacent to a previously programmed second wordline in the selected memory block, and storing the program data in memory cells connected to a third wordline adjacent to the first wordline.

In certain embodiments, storing the program data of the open block program operation comprises performing a fine program operation on a wordline adjacent to a forcibly fine-programmed wordline in the selected memory, and storing the program data in the selected memory block according to a predetermined program sequence.

In certain embodiments, the program data is stored in the selected memory block before the fine program operation is performed on the wordline adjacent to the forcibly fine-programmed wordline.

In certain embodiments, the fine program operation on the wordline adjacent to the forcibly fine-programmed wordline is performed on un-programmed memory cells.

In certain embodiments, the method further comprises, where the requested program operation is determined not to be a random program operation or an open block program operation, storing program data in a memory block of the multi-bit memory device according to the requested program operation.

According to another embodiment of the inventive concept, a method is provided for operating a memory system comprising a multi-bit memory device. The method comprises determining whether a requested program operation is a random program operation, where the requested program operation is determined to be a random program operation, determining whether the requested program operation is an open block program operation, and where the requested program operation is determined to be an open block program operation, reading multi-bit data from memory cells of a coarse-programmed wordline before performing a coarse program operation on a wordline adjacent to the coarse-programmed wordline in an open block of the multi-bit memory device.

In certain embodiments, the method further comprises storing program data of the requested program operation in the open block of the multi-bit memory device.

In certain embodiments, the method further comprises performing a fine program operation on the coarse-programmed wordline based on the multi-bit data after the coarse program operation is performed on the wordline adjacent to the coarse-programmed wordline.

In certain embodiments, the method further comprises operating an error correction code unit to correct an error in the multi-bit data read from the memory cells of the coarse-programmed wordline, and performing the fine program operation on the coarse-programmed wordline using the multi-bit data having the corrected error.

In certain embodiments, the fine program operation is performed on the coarse-programmed wordline after the coarse program operation is performed on the wordline adjacent to the coarse-programmed wordline.

In certain embodiments, the multi-bit memory device stores 3-bit data through a reoperation comprising a first-step program operation, a coarse program operation, and a fine program operation.

In certain embodiments, the reprogram operation is performed using an address scrambling method.

According to another embodiment of the inventive concept, a memory system comprises a multi-bit memory device comprising a plurality of memory blocks, and a memory controller configured to control the multi-bit memory device by managing an open block of the multi-bit memory device according to a fine program close policy whereby a fine program operation is performed on a coarse-programmed wordline in the open block after a random program operation is requested and before the random program operation is performed.

In certain embodiments, the memory controller detects a requested program operation, determines whether the requested program operation is an open block program operation, and upon detecting that the requested program operation is an open block program operation, controls the multi-bit memory device to skip a program operation on a wordline adjacent to a previously programmed uppermost wordline in the open block and to store program data in the open block according to a predetermined program sequence.

In certain embodiments, the memory controller detects a requested program operation, determines whether the requested program operation is an open block program operation, and upon detecting that the requested program operation is an open block program operation, controls the multi-bit memory device to perform a fine program operation on a wordline adjacent to a forcibly fine-programmed wordline in the open block and to store program data in the open block according to a predetermined program sequence.

In certain embodiments, the memory controller controls the multi-bit memory device to perform a fine program operation on un-programmed memory cells connected to a wordline adjacent to a forcibly fine programmed wordline in the open block.

In certain embodiments, the memory controller is further configured to control the multi-bit memory device by managing another open block of the multi-bit memory device according to a fine program open policy whereby a fine program operation is not performed on a coarse-programmed wordline in the another open block after a random program operation is requested and before the random program operation is performed.

In certain embodiments, the memory controller detects a requested program operation, determines whether the requested program operation is an open block program operation, and upon detecting that the requested program operation is an open block program operation, controls the multi-bit memory device to read multi-bit data from memory cells of the coarse-programmed wordline in the another open block, perform an error correction operation on the multi-bit data, and then perform a fine program operation to store the multi-bit data in the memory cells after a coarse program operation has been performed on a wordline adjacent to the memory cells.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the term "and/or" indicates any and all combinations of one or more of the associated listed items. Where one feature is referred to as being "connected/coupled" to another feature, the former may be "directly connected" to the latter, or "indirectly connected" to the latter through at least one intervening feature. Terms in a singular form encompass plural forms unless otherwise specified. Terms such as "include," "comprise," "including," and "comprising," specify an associated feature, but do not exclude additional features.

The described embodiments relate generally to nonvolatile memory devices capable of storing more than one bit of data per memory cell. As the number of bits per memory cell increases, the reliability of stored data can decrease due to coupling between adjacent memory cells. For instance, due to coupling between adjacent memory cells, a program operation of one memory cell can change a program state of an adjacent memory cell. To reduce the effects of coupling, certain embodiments of the inventive concept use an address scrambling method to determine the order in which data is programmed in multi-bit memory cells.

Figure 1:
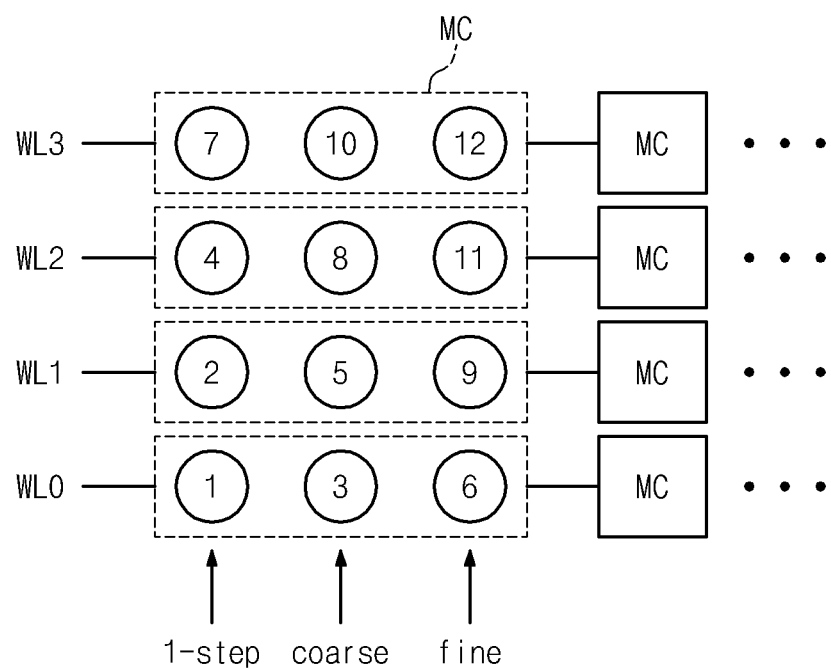
FIG. 1 illustrates an address scrambling method used to determine the order in which data is programmed in 3-bit memory cells of a nonvolatile memory device according to an embodiment of the inventive concept.

FIG. 1 illustrates an address scrambling method used to determine an order for programming 3-bit memory cells of a nonvolatile memory device.

Referring to FIG. 1, a nonvolatile memory device comprises a plurality of memory cells MC connected to four wordlines WL0 through WL3. Each of memory cells MC can be programmed to store three bits of data through a three-step process comprising a first-step program operation, a coarse program operation, and a fine program operation.

The first-step program operation stores 2 bits of data in each memory cell. For instance, the first-step program operation can be used to program each memory cell from an erase state "11" to one of states "11", "10", "00", and "01". The coarse program operation stores a third bit of data in each memory cell. For instance, the coarse program operation can be used to program each memory cell from one of states "11", "10", "00", and "01" to one of states "111", "110", "100", "101", "011", "010", "000", and "001". The fine program operation refines the threshold voltages of memory cells programmed with three bits of data. Accordingly, the fine program operation can be used to ensure that the threshold voltages fall within precisely defined threshold voltage distributions providing adequate sensing margins for read operations of the programmed memory cells.

In the example of FIG. 1, the first-step program operation ① is first performed on each memory cell connected to a first wordline WL0. This can also be referred to as a first-step program operation of first wordline WL0. During the first-step program operation, two pages of data are stored in memory cells connected to first wordline WL0.

Next, a first-step program operation ② is performed on a second wordline WL1. After the first-step program operation is performed on second wordline WL1, a coarse program operation ③ is performed to store a third bit of data in the memory cells connected to first wordline WL0. This can also be referred to as a coarse program operation of first wordline WL0.

After the coarse program operation is performed on first wordline WL0, a first-step program operation ④ is performed on a third wordline WL2. After the first-step program operation is performed on third wordline WL2, a coarse program operation ⑤ is performed to store a third bit of data in the memory cells connected to second wordline WL1.

Next, a fine program operation ⑥ is performed on memory cells connected to first wordline WL0. This can also be referred to as a fine program operation of first wordline WL0. Thereafter, the first-step, coarse, and fine program operations are performed on other wordlines according to a sequence illustrated in FIG. 1.

Although the address scrambling method of FIG. 1 is used to program 3-bit data, the method can be modified to program n-bit data, where n can be any integer greater than or equal to two.

The first-step program operation and the coarse program operation form threshold voltage distributions corresponding to 3-bit data. Although the coarse program operation programs the threshold voltage distributions corresponding to the 3-bit data, the threshold voltage distributions may not have sufficient margins to clearly distinguish between them in a read operation. Accordingly, the fine program operation is performed to achieve threshold voltage distributions with adequate sensing margins. The fine program operation narrows the widths of the respective threshold voltage distributions. The fine program operation can be performed using verification voltages that are higher than verification voltages used in the coarse program operation. By programming memory cells using the method of FIG. 1, the effects of coupling between adjacent memory cells can be reduced. The three-step process of FIG. 1 can be referred to as a three-step reprogram method. This three-step process can be extended into an N-step reprogram method to program different numbers of bits nonvolatile memory cells.

In the N-step reprogram method, program data is retained in a temporary storage device, such as a buffer within a memory controller, until the fine program operation is completed. The program data is accessed in the fine program operation to ensure that the program data is accurately reflected in the threshold voltages of selected memory cells.

Program data to be stored in a multi-bit memory device can be classified as sequential data or random data. Sequential data is data to be written in the same memory block using a program sequence such as that illustrated in FIG. 1, and random data is data to be written in a different memory block from a previous program operation. A program operation for random data is referred to as a random program operation, and a program operation for sequential data is referred to as a sequential program operation.

A random program operation may be requested between a coarse program operation and a fine program operation of a current memory block. As a result, the fine program operation may be delayed by the random program operation. A memory block where at least one memory cell has been programmed with a coarse program operation but not a fine program operation is referred to as an open block. Memory cells where the fine program operation has not been performed may be unreliable due to coupling with adjacent memory cells, as will be described with reference to FIG. 2.

Figure 2:
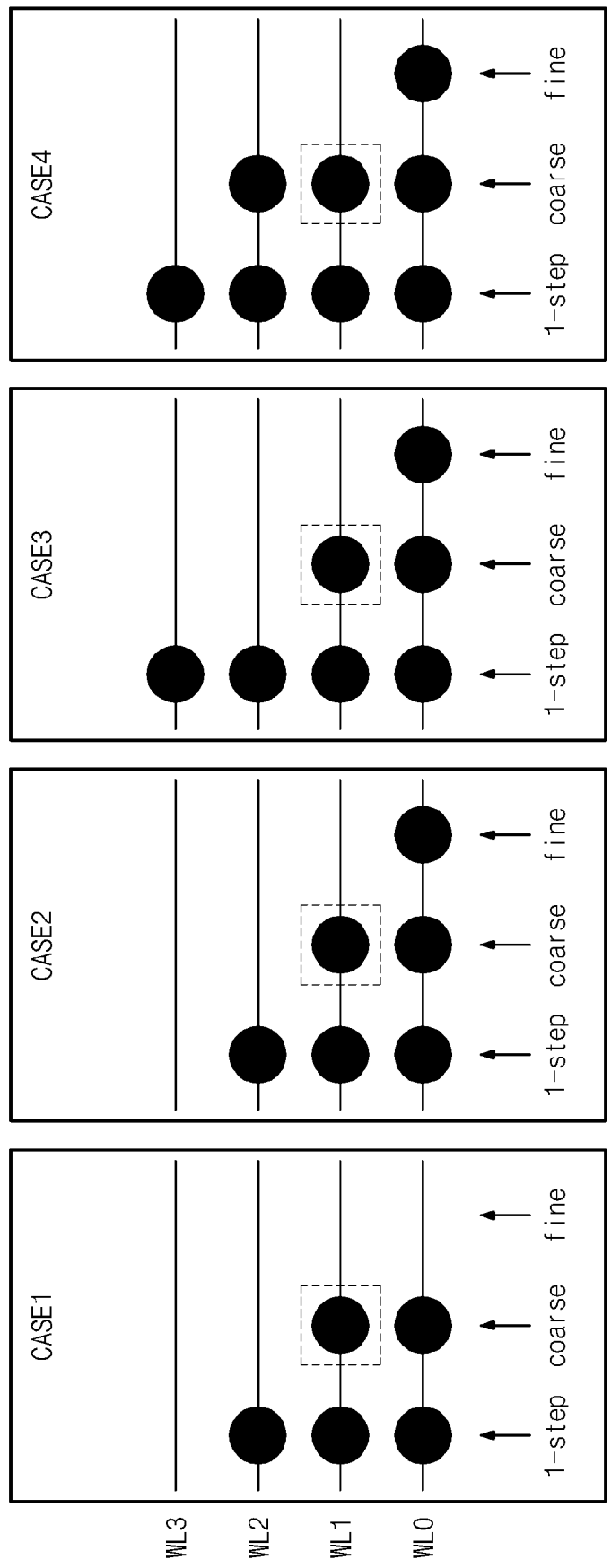
FIG. 2 is a diagram illustrating electrical coupling between adjacent memory cells at different stages of programming a memory block.

FIG. 2 shows various examples of memory cells that have been programmed with a coarse program operation but not a fine program operation. In each of these examples, referred to as first through fourth cases, memory cells connected to second wordline WL1 have been programmed by a coarse program operation indicated by a dotted box, but they have not been programmed with a fine program operation. Accordingly, a memory block containing these memory cells is an open block.

In a first case CASE1, a coarse program operation has been performed on memory cells connected to second wordline WL1 and first wordline WL0. In a second case CASE2, a fine program operation has been further performed on memory cells connected to first wordline WL0. In a third case CASE3, a first-step program operation has been further performed on memory cells connected to fourth wordline WL3. In a fourth case CASE4, a coarse program operation has been further performed on memory cells connected to third wordline WL2.

As the number of open blocks increases due to random program operations, a memory controller may require a larger capacity buffer memory to maintain data necessary for fine program operations. For example, for an open block corresponding to the second example of FIG. 2, the memory controller maintains data stored in memory cells connected to second wordline WL1 and third wordline WL2. Similarly, for an open block corresponding to the third example of FIG. 2, the memory controller maintains data stored in memory cells connected to second wordline WL1, third wordline WL2, and fourth wordline WL3.

Figure 3:
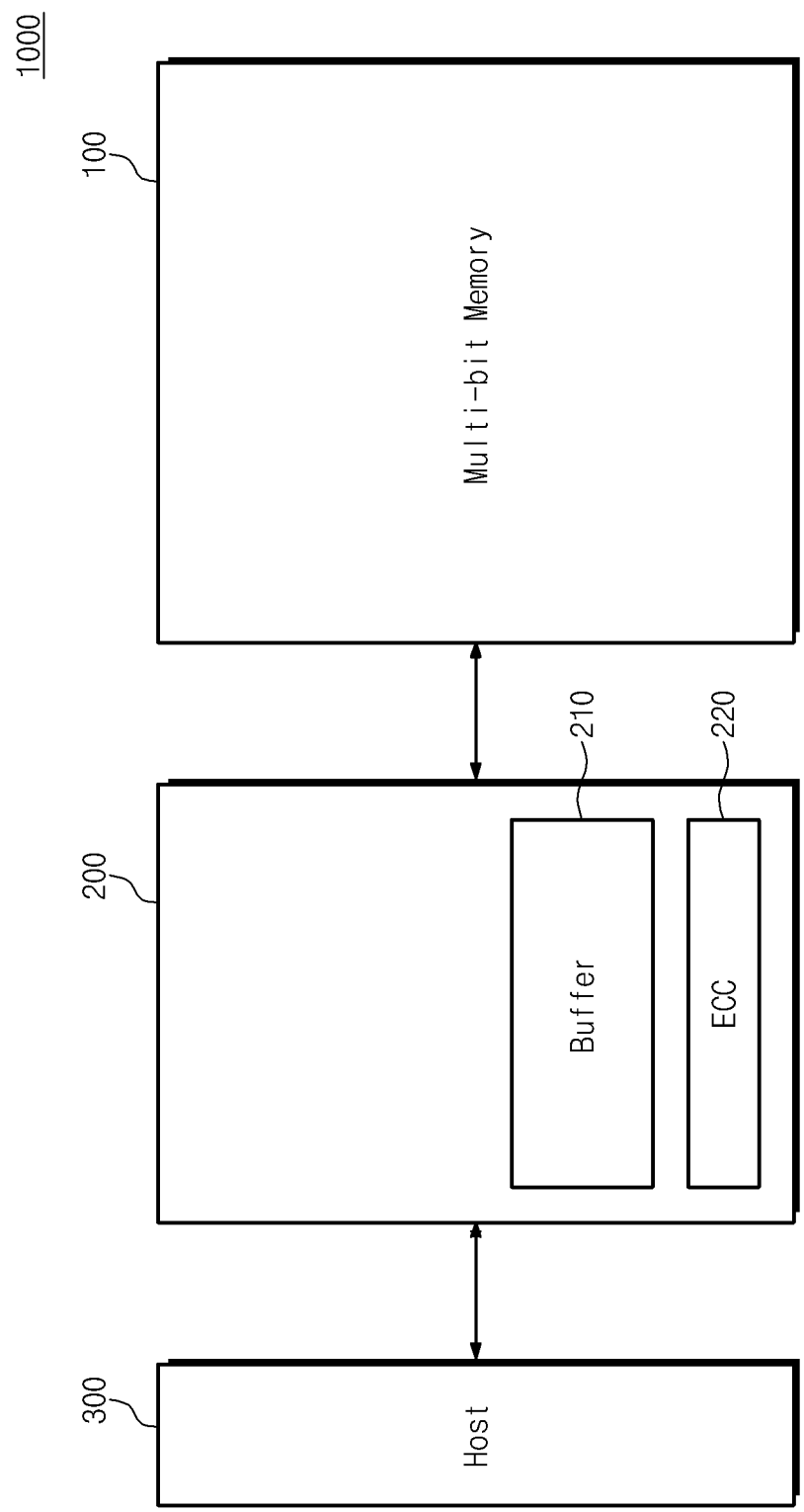
FIG. 3 is a diagram illustrating a memory system according to an embodiment of the inventive concept.

FIG. 3 is a diagram illustrating a memory system 1000 according to an embodiment of the inventive concept.

Referring to FIG. 3, memory system 1000 comprises a multi-bit memory device 100, a memory controller 200, and a host 300. Multi-bit memory device 100 typically comprises one or more memory chips. In certain embodiments, multi-bit memory device 100 and memory controller 200 form a portable device, such as a memory card, a solid state drive (SSD), or a memory stick.

Multi-bit memory device 100 comprises a plurality of memory blocks each comprising memory cells arranged rows and columns. The memory cells each store multi-bit data. The memory cells can be arranged to have a two-dimensional array structure or a three-dimensional/vertical array structure. Examples of three-dimensional array structures are disclosed in U.S. Pat. Pub. No. 2008/0023747 entitled "SEMICONDUCTOR MEMORY DEVICE WITH MEMORY CELLS ON MULTIPLE LAYERS" and U.S. Pat. Pub. No. 2008/0084729 entitled "SEMICONDUCTOR DEVICE WITH THREE-DIMENSIONAL ARRAY STRUCTURE," the respective disclosures of which are hereby incorporated by reference in their entirety.

Memory controller 200 is configured to control multi-bit memory device 100 in response to requests from host 300. Memory controller 200 comprises a buffer memory 210 and an error correction code (ECC) unit 220. Buffer memory 210 temporarily stores data received from host 300 and temporarily stores data read from multi-bit memory device 100. ECC unit 220 is configured to generate ECC codes from data to be stored in multi-bit memory device 100. ECC unit 220 is configured to correct errors in data read from multi-bit memory device 100 based on the ECC codes. Memory controller 200 uses various fine program policies to manage open blocks generated due to random program operations and to manage coupling effects in memory cells of open blocks. Examples of these fine program policies will be described below. By efficiently managing the open blocks and the coupling effects using memory controller 200, the reliability of stored data can be improved and a proper size of buffer memory 210 can be maintained.

FIGS. 4 through 8 are diagrams illustrating various methods of managing open blocks in data processing systems according to embodiments of the inventive concept. In the description that follows, example method steps are indicated by parentheses (BXXX).

In the methods of FIGS. 4 through 8, it is assumed that a memory block BLKi is an open block, and host 300 has requested a random program operation with respect to another memory block BLKj. In the drawings, program operations are also referred to as write operations.

Figure 4:
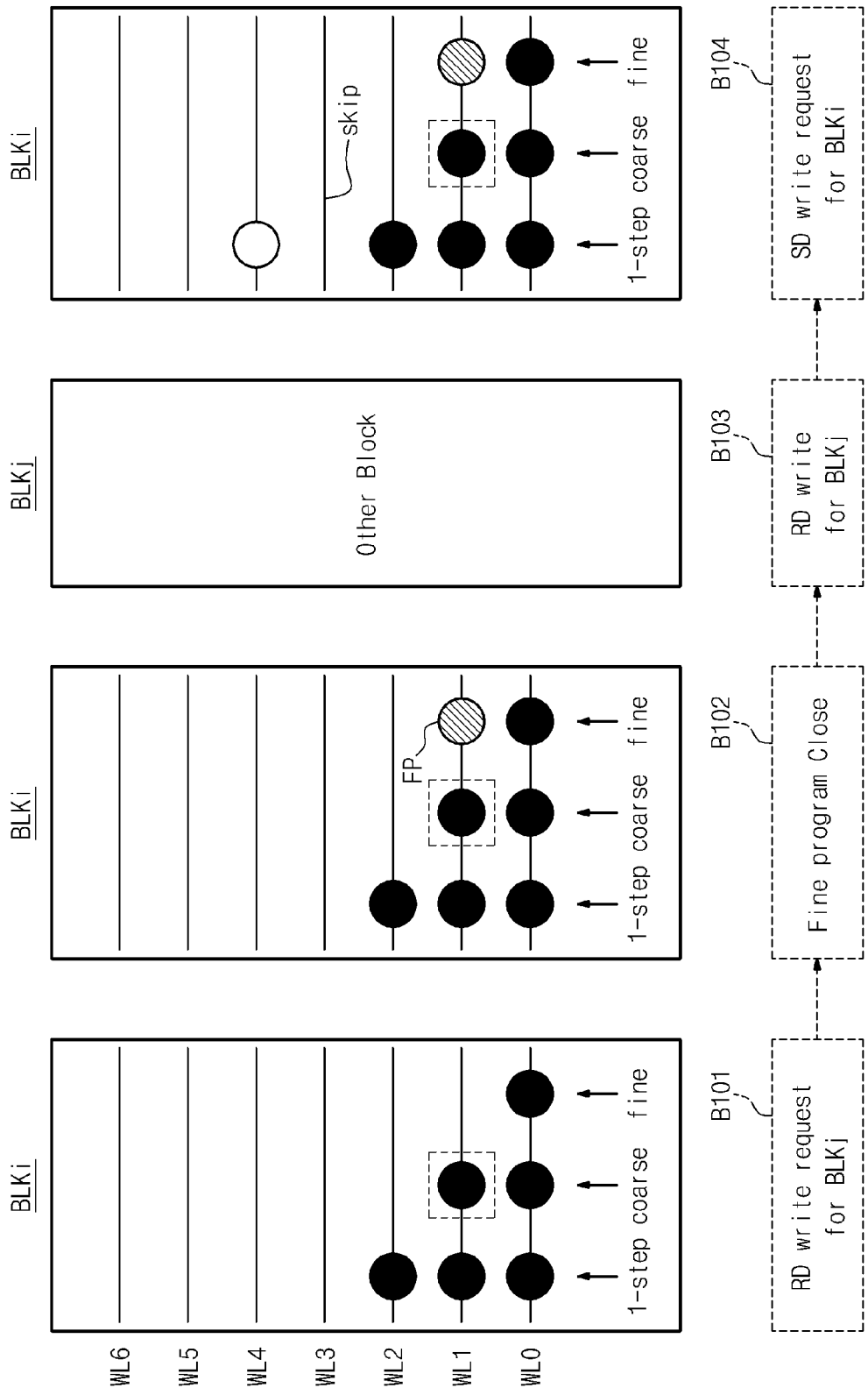
FIGS. 4 through 8 are diagrams illustrating various methods of managing open blocks in data processing systems according to embodiments of the inventive concept.

In the method of FIG. 4, memory block BLKi has the configuration of second case CASE2 in FIG. 2 when the random program operation is requested with respect to memory block BLKj (B101). In response to the request, memory controller 200 controls multi-bit memory device 100 to perform a fine program operation FP on coarse-programmed second wordline WL1 (B102). Following the fine program operation FP, memory controller 200 does not need to retain a copy of data stored in the memory cells of second wordline WL1.

Next, memory controller 200 controls multi-bit memory device 100 to store program data in memory block BLKj (B103). This can be performed using a process such as that described with reference to FIG. 1.

Where a subsequent program operation is requested for memory block BLKi, memory controller 200 controls multi-bit memory device 100 to omit a program operation on an upper wordline WL3 (also referred to as a skip wordline) adjacent to an uppermost wordline WL2 where memory cells were programmed prior to the random program operation. Instead, memory controller 200 controls multi-bit memory device 100 to perform a program operation on an upper wordline WL4 adjacent to skip wordline WL3 (B104). By omitting the program operation for the skip wordline, the method reduces the likelihood that memory cells connected to uppermost wordline WL2 will be disturbed by coupling with adjacent memory cells.

In the method of FIG. 4, the fine program operation FP is performed after the random program operation is requested, but before the random program operation is performed. By performing the fine program operation FP in this order, potential errors are avoided in the open block, and the amount of data stored in buffer memory 210 can be reduced. A policy of performing pending fine program operations prior to performing requested random program operations is referred to as a fine program close policy.

Figure 5:
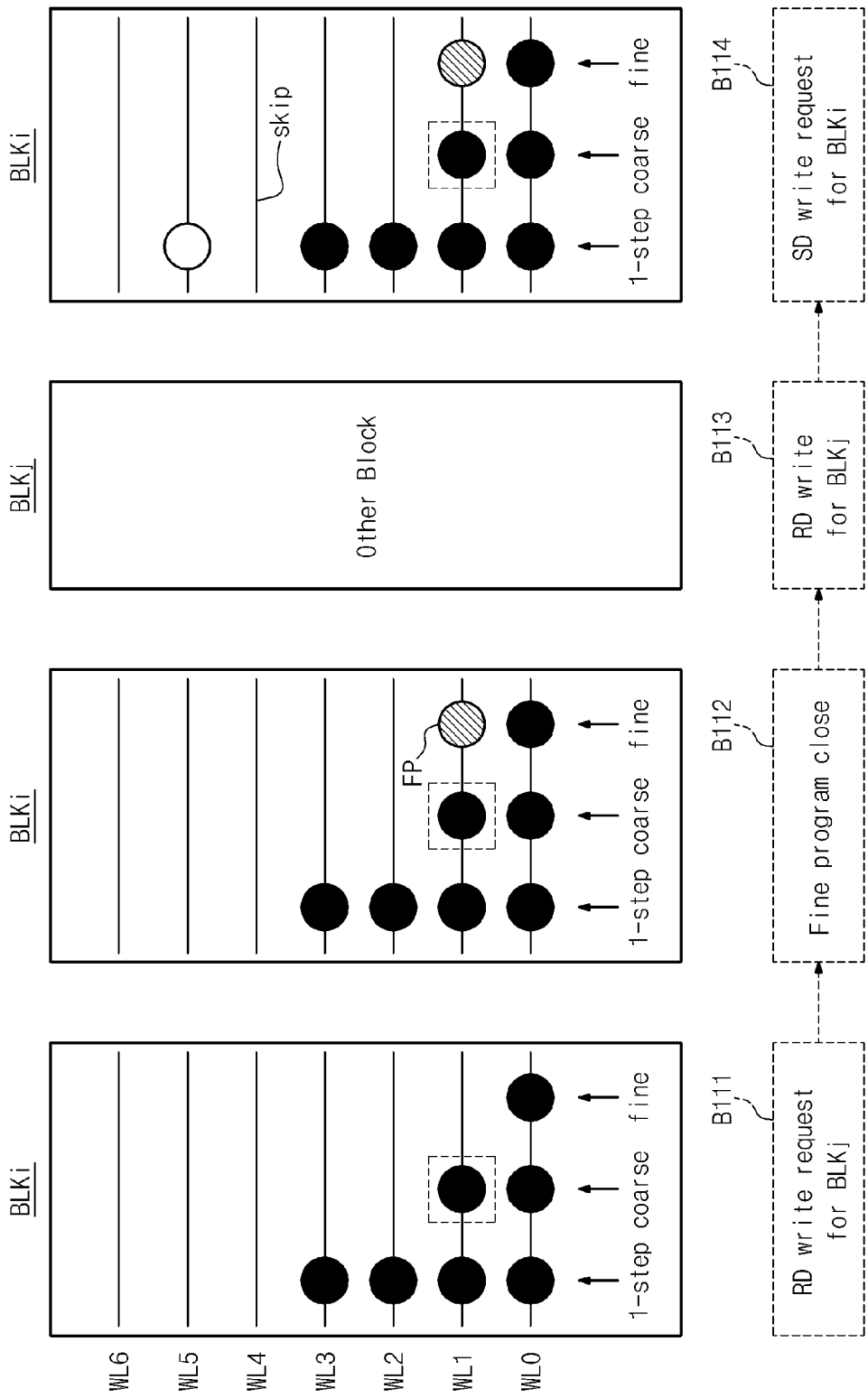

In the method of FIG. 5, memory block BLKi has the configuration of third case CASE3 in FIG. 2 when the random program operation is requested with respect to memory block BLKj (B111). In response to the request, memory controller 200 controls multi-bit memory device 100 to perform a fine program operation FP on coarse-programmed second wordline WL1 (B112). After the fine program operation FP, memory controller 200 does not need to retain a copy of data stored in the memory cells of second wordline WL1.

Thereafter, memory controller 200 controls multi-bit memory device 100 to store program data received from host 300 in memory block BLKj (B113). This can be performed using a process such as that described with reference to FIG. 1.

Where a subsequent program operation is requested for memory block BLKi, memory controller 200 controls multi-bit memory device 100 to omit a program operation on an upper wordline WL4 (also referred to as a skip wordline) adjacent to an uppermost wordline WL3 where memory cells were programmed prior to the random program operation. Instead, memory controller 200 controls multi-bit memory device 100 to perform a program operation on an upper wordline WL5 adjacent to skip wordline WL4 (B114). Like the method of FIG. 4, the method of FIG. 5 uses a fine program close policy.

Figure 6:
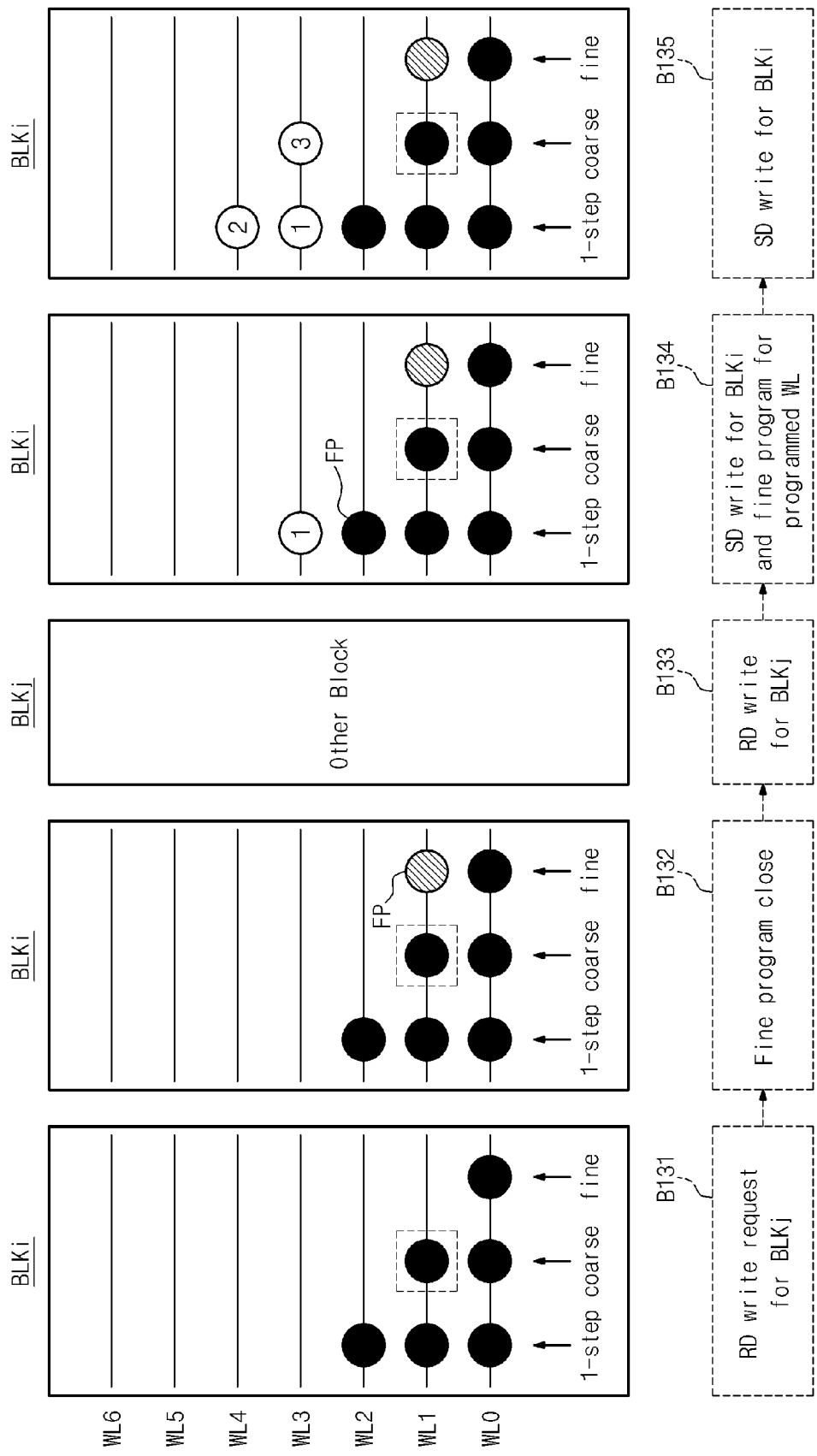

In the method of FIG. 6, memory block BLKi has the configuration of second case CASE2 in FIG. 2 when the random program operation is requested with respect to memory block BLKj (B131). In response to the request, memory controller 200 controls multi-bit memory device 100 to perform the fine program FP operation on the coarse-programmed second wordline WL1 (B132). After the fine program operation FP, memory controller 200 does not need to maintain data stored in memory cells of second wordline WL1.

Next, memory controller 200 controls multi-bit memory device 100 to store program data received from host 300 in memory block BLKj (B133). The random program operation can be performed using a process such as that described with reference to FIG. 1.

Upon resuming programming of memory block BLKi, memory controller 200 controls multi-bit memory device 100 to perform a fine program operation on an upper wordline WL2 adjacent to second wordline WL1 (B134). In this case, additional program operations (e.g., coarse program operations and fine program operations) are omitted for upper wordline WL2 where only a first-step program operation has been performed. The program data is stored in memory cells of upper wordline WL3 adjacent to wordline WL2 by a first-step program operation ①. The program data is stored in the memory cells of wordline WL3 before or after a fine program operation is performed on wordline WL2.

The fine program operation (or 2-bit fine program operation) on wordline WL2 can be performed using higher verification voltages than those used in the first-step program operation. After the fine program operation of wordline WL2, further data is programmed in memory block BLKi according to the program sequence described in FIG. 1 (B135). Like the methods of FIGS. 4 and 5, the method of FIG. 6 uses a fine program close policy.

Figure 7:
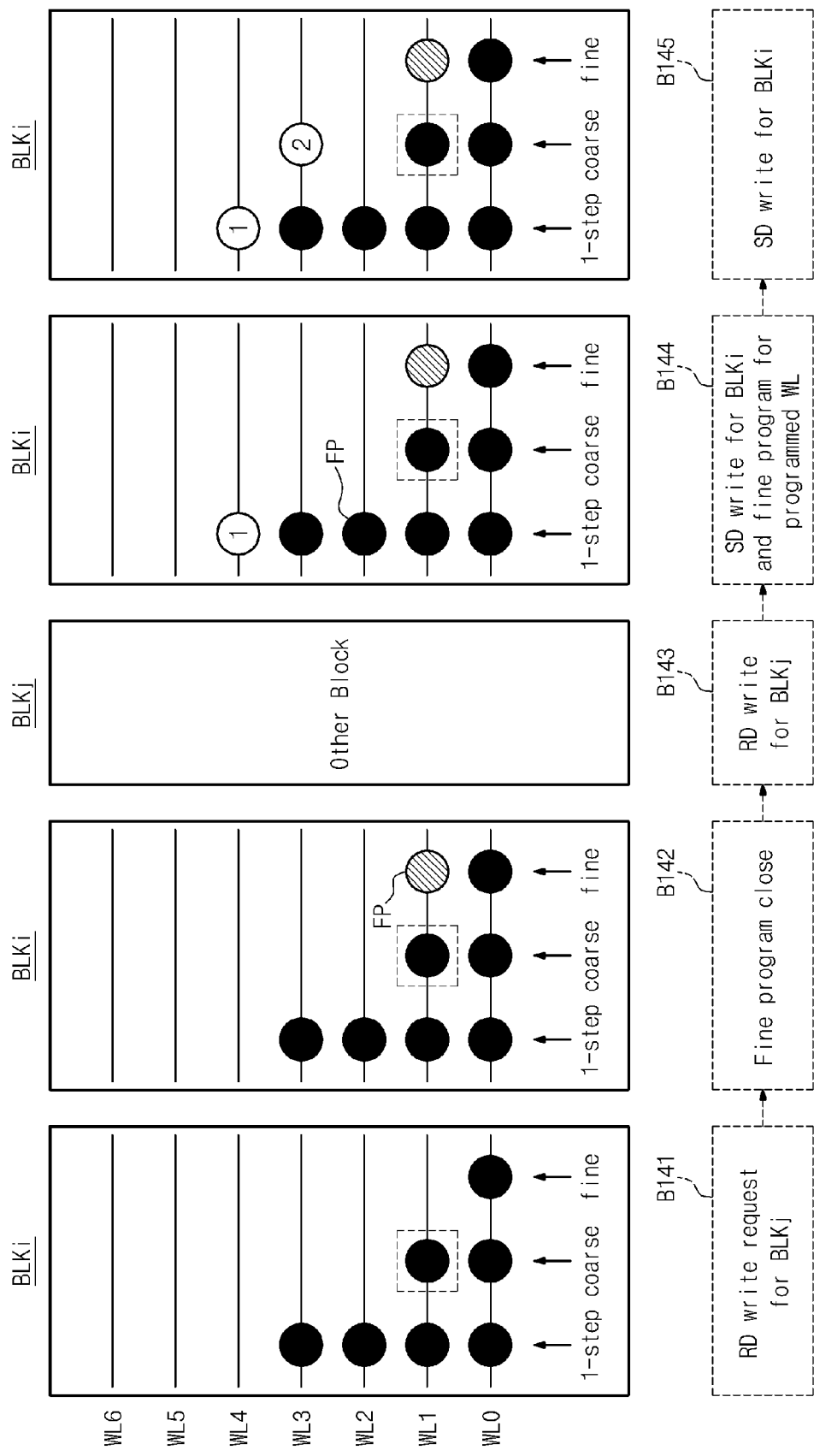

In the method of FIG. 7, memory block BLKi has the configuration of third case CASE3 in FIG. 2 when the random program operation is requested with respect to memory block BLKj (B141). In response to the request, memory controller 200 controls multi-bit memory device 100 to perform a fine program operation FP on coarse-programmed second wordline WL1 (B142). After the fine program operation FP, memory controller 200 does need to retain a copy of data stored in the memory cells of second wordline WL1.

Next, memory controller 200 controls multi-bit memory device 100 to store program data received from host 300 in memory block BLKj (B143). This can be performed using a process such as that described with reference to FIG. 1.

Upon resuming programming of memory block BLKi, memory controller 200 controls multi-bit memory device 100 to perform a fine program operation FP on upper wordline WL2 adjacent to second wordline WL1 (B144). Additional program operations are omitted for wordline WL2 where only a first-step program operation has been performed. Program data is stored in memory cells of upper wordline WL4 adjacent to uppermost wordline WL3 among the programmed wordlines using a first-step program operation ①.

The fine program operation (or 2-bit fine program operation) on wordline WL2 can be performed using higher verification voltages than those used in the first-step program operation. After the fine program operation of wordline WL2, further data is programmed in memory block BLKi according to the program sequence described in FIG. 1 (B145). Like the methods of FIGS. 4 through 7, the method of FIG. 7 also uses a fine program close policy.

Figure 8:
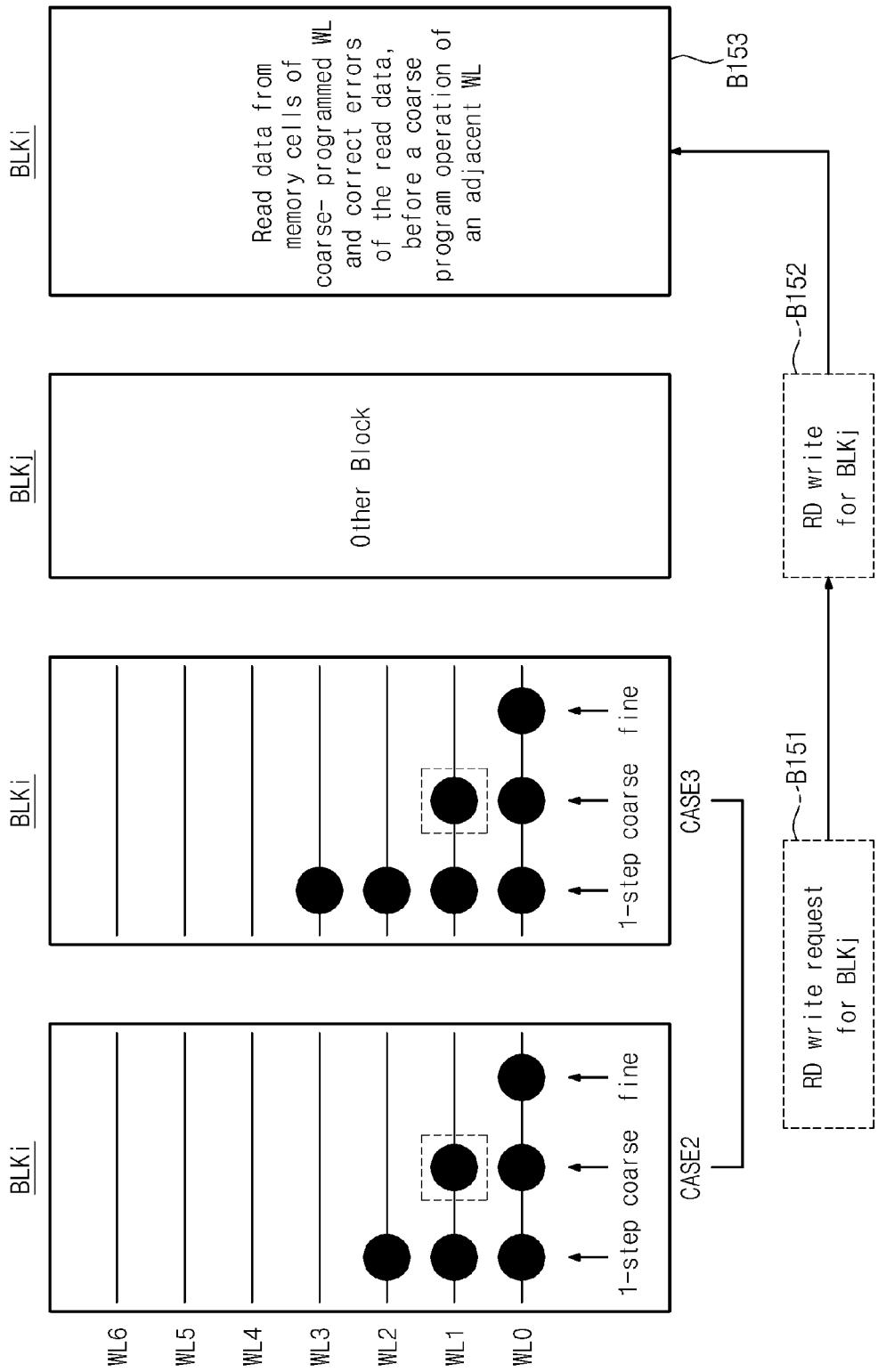

In the method of FIG. 8, host 300 requests a random program operation on memory block BLKj while a program operation is being performed on memory block BLKi (B151). In response to the request, memory controller 200 controls multi-bit memory device 100 to store program data in memory block BLKj (B152). However, unlike the methods of FIGS. 4 through 7, the method of FIG. 8 performs the random program operation without first performing a fine program operation on coarse-programmed second wordline WL1 of memory block BLKi. The random program operation can be performed using a process such as that described with reference to FIG. 1.

Upon resuming programming of memory block BLKi, memory controller 200 controls multi-bit memory device 100 to read data from memory cells of coarse-programmed second wordline WL1 before a coarse program operation is performed on a wordline adjacent to the coarse-programmed wordline (B153). The read data is stored in buffer memory 210 of memory controller 200, and ECC unit 220 corrects errors in the read data. Then, the corrected read data is transmitted to multi-bit memory device 100 and a fine program operation is performed on coarse-programmed second wordline WL1 based on the corrected read data.

Figure 9:
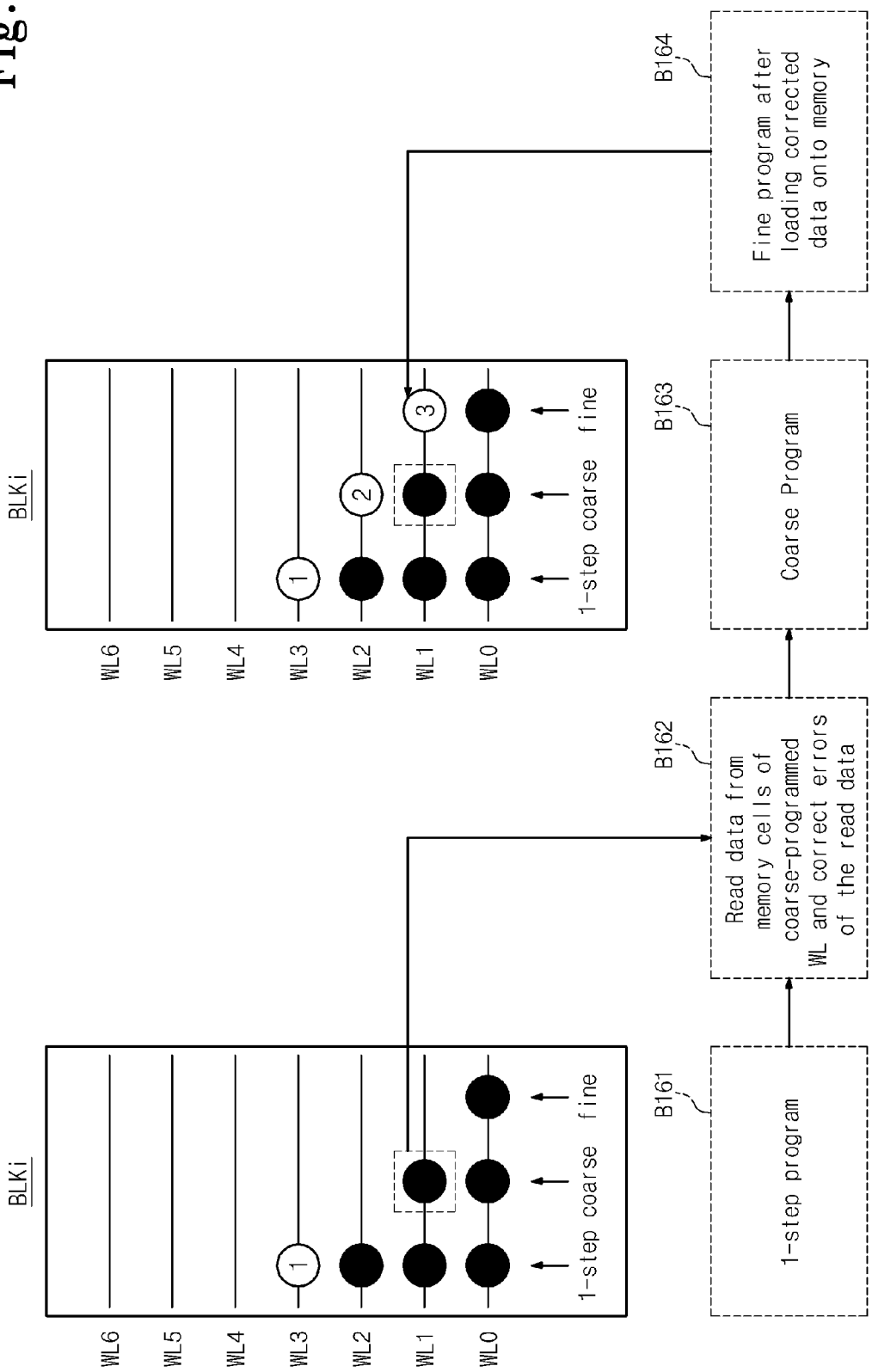
FIGS. 9 and 10 are diagrams illustrating examples of an operation B153 of FIG. 8 according to embodiments of the inventive concept.

FIG. 9 is a diagram illustrating an example of operation B153 shown in FIG. 8. In the example of FIG. 9, memory block BLKi has the configuration of second case CASE2 of FIG. 2.

Referring to FIG. 9, upon resuming programming of memory block BLKi, program data is stored in memory cells of wordline WL3 by a first-step program operation ①(B161). Next, using the program sequence described in FIG. 1, program data is stored in the memory cells of third wordline WL2 by a coarse program operation ②. Before a coarse program operation is performed on third wordline WL2, data is read from the memory cells of coarse-programmed second wordline WL1. Accordingly, memory controller 200 controls multi-bit memory device 100 to read data from the memory cells of coarse-programmed second wordline WL1 (B162).

The read data is stored in buffer memory 210 of memory controller 200, and ECC unit 220 of memory controller 200 corrects errors in the read data.

After data has been read from coarse-programmed second wordline WL1, program data is stored in the memory cells of third wordline WL2 by a coarse program operation ② (B163). Next, in a fine program operation ③ of coarse-programmed second wordline WL1, read data stored in memory controller 200 is loaded into multi-bit memory device 100. Once the data stored in memory controller 200 is loaded to multi-bit memory device 100, fine program operation ③ is performed on second wordline WL1 of open block BLKi (B164).

In the method of FIG. 9, where a random program operation is requested, fine program operation ③ is performed on coarse-programmed second wordline WL1 of open block BLKi after the random program operation. A policy of performing pending fine program operations after performing requested random program operations is referred to as a fine program open policy.

Figure 10:
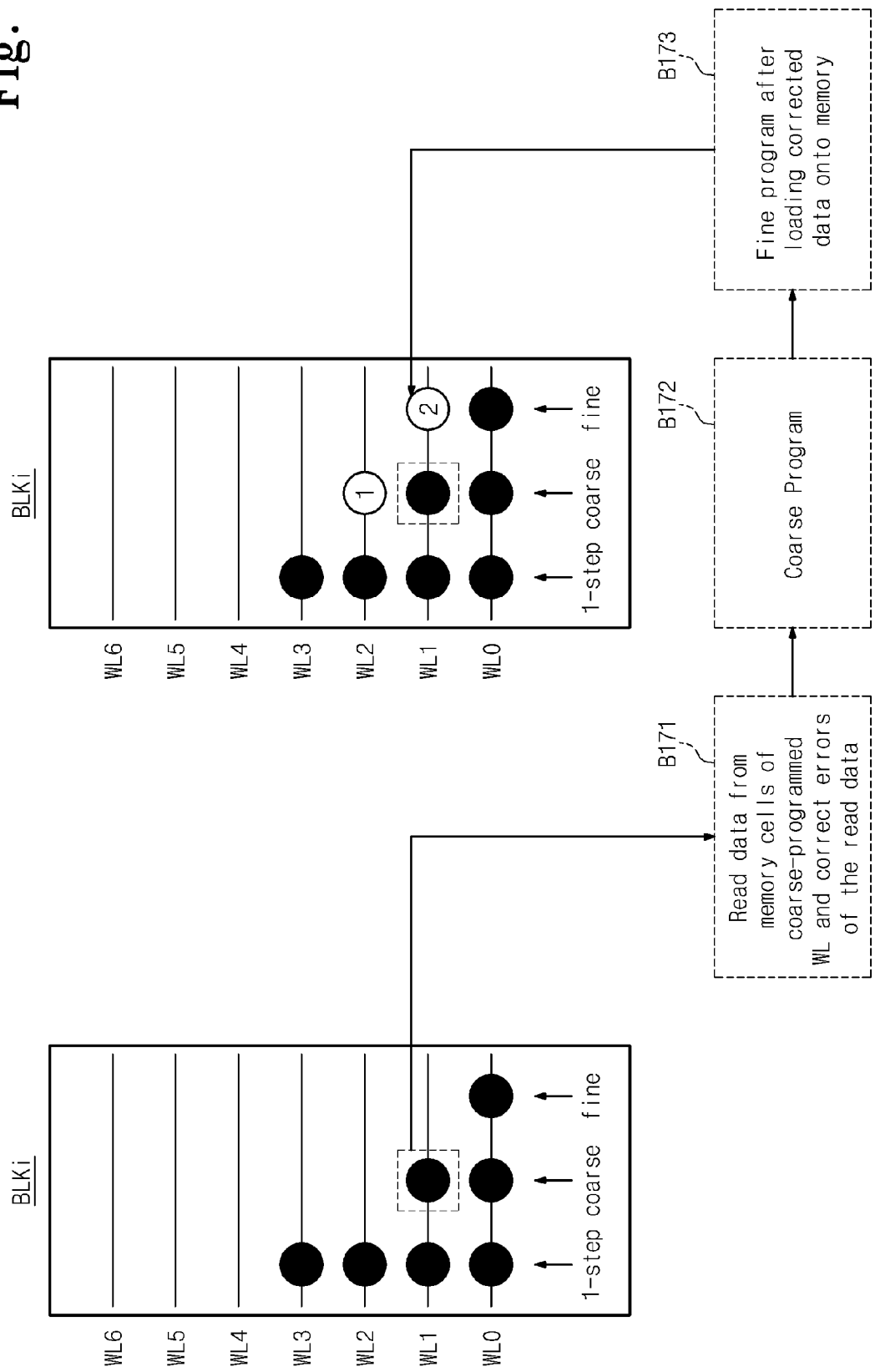

FIG. 10 is a diagram illustrating operation B153 shown in FIG. 8 according to another embodiment of the inventive concept.

In the method of FIG. 10, memory block BLKi corresponds to third case CASE3 of FIG. 2. Upon resuming a program operation of memory block BLKi, program data is read from coarse-programmed memory cells connected to second wordline WL1 before a coarse program operation ① is performed on third wordline WL2 (B171). The data read from the memory cells of second wordline WL1 is stored in buffer memory 210 of memory controller 200, and ECC unit 220 of memory controller 200 corrects errors in the read data.

Next, program data is stored in memory cells of wordline WL2 by a coarse program operation ① (B172). Then, the read data stored in memory controller 200 is loaded into multi-bit memory device 100, and a fine program operation ② is performed on coarse-programmed wordline WL1 based on the read data (B173).

In the method of FIG. 10, the fine program operation is performed on coarse-programmed second wordline WL1 after resuming a program operation following a random program operation. Accordingly, the method of FIG. 10 uses a fine program open policy.

Figure 11:
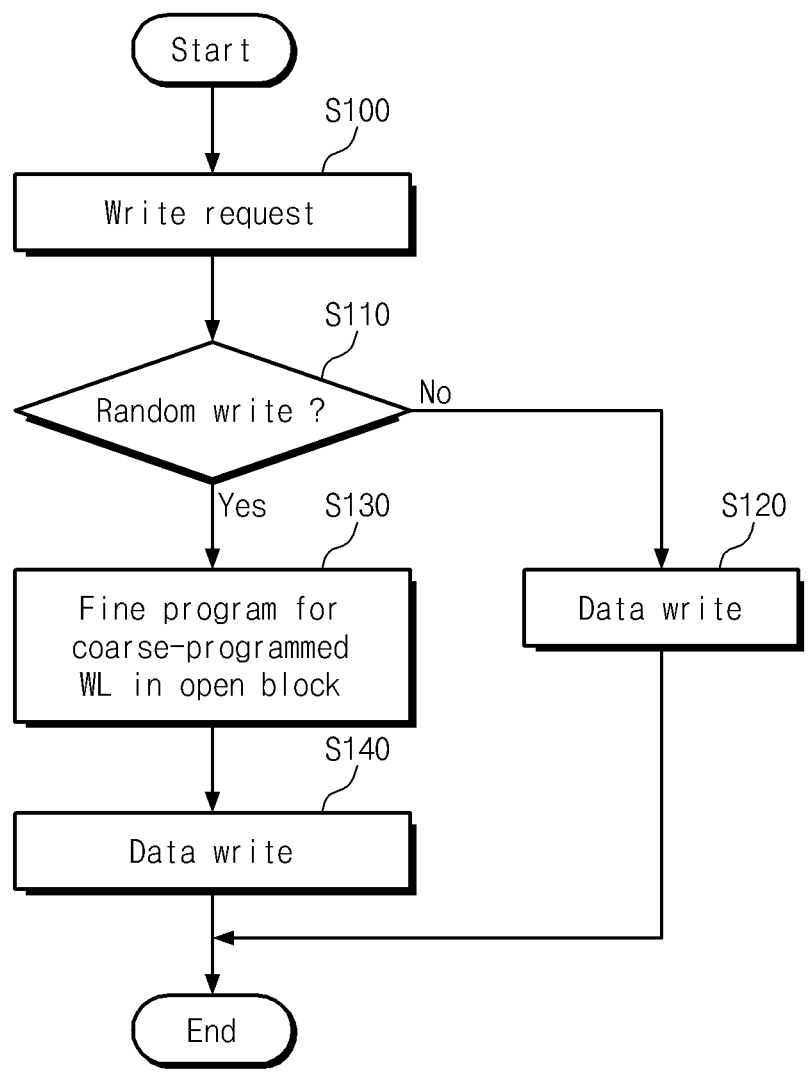
FIGS. 11 through 14 are flowcharts illustrating various methods of programming memory systems according to embodiments of the inventive concept.

FIG. 11 is a flowchart illustrating a method of programming a memory system according to an embodiment of the inventive concept.

Referring to FIG. 11, host 300 requests a program operation from memory controller 200 (S100). Then, memory controller 200 determines whether the program operation requested by host 300 is a random program operation (S110). The random program operation indicates that a previously requested program operation and a currently requested program operation correspond to different memory blocks. Where the program operation requested by host 300 is determined not to be a random program operation (S110=No), memory controller 200 controls multi-bit memory device 100 to store program data in the same memory block (S120).

Where the program operation requested by host 300 is determined to be a random program operation (S110=Yes), memory controller 200 controls multi-bit memory device 100 to perform a fine program operation on the coarse-programmed wordline in the open block (S130). The fine program operation can be performed using a method such as those described in FIGS. 4 through 7. Next, memory controller 200 controls multi-bit memory device 100 to store the program data in another memory block (S140).

Figure 12:
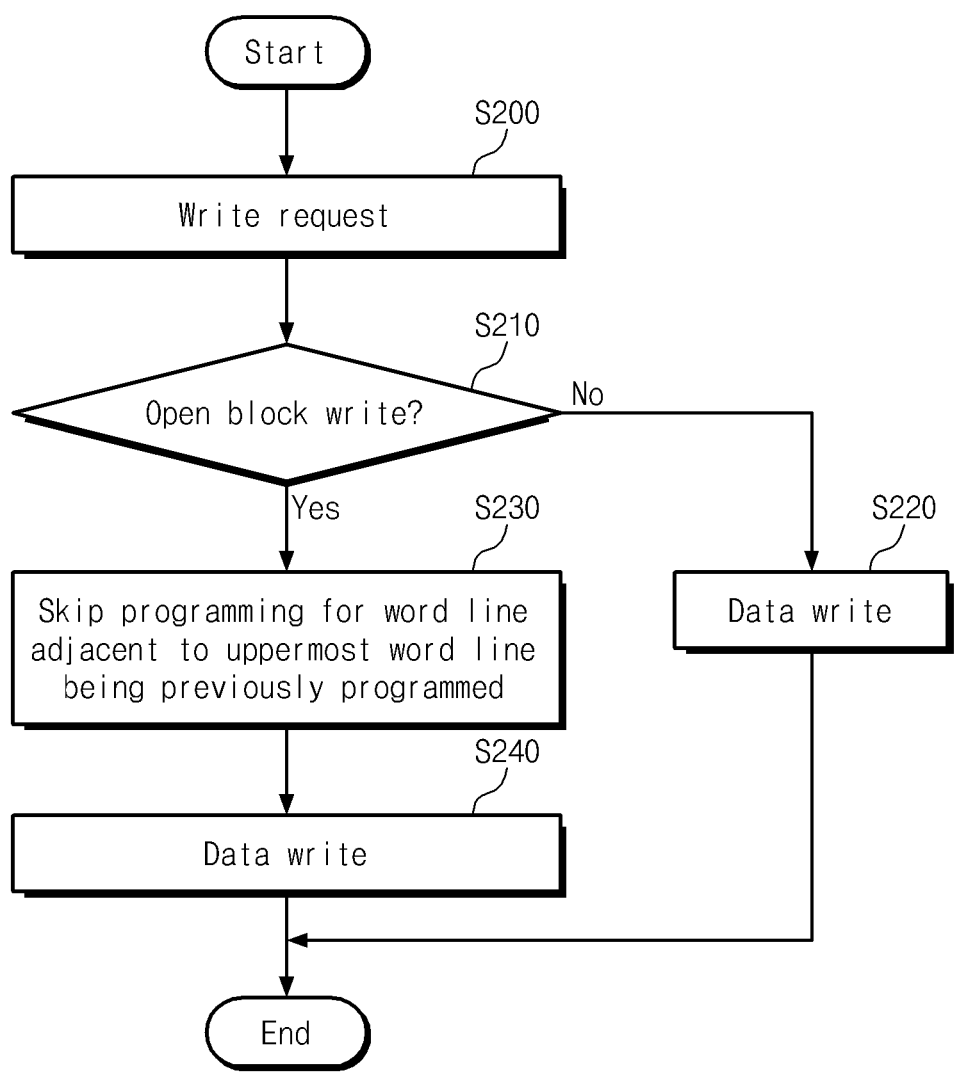

FIG. 12 is a flowchart illustrating a method of programming a memory system according to another embodiment of the inventive concept.

Referring to FIG. 12, host 300 requests a program operation from memory controller 200 (S200). Then, memory controller 200 determine whether the program operation requested by host 300 is an open block-related program operation (hereinafter, referred to as an open block program operation) (S210). The open block may be determined according to conditions described with reference to FIG. 2. Where the program operation requested by host 300 is determined not to be an open block program operation (S210=No), memory controller 200 controls multi-bit memory device 100 to store program data in a memory block other than the open block (S220).

Where the program operation requested by host 300 is determined to be an open block program operation (S210=Yes), memory controller 200 omits programming of a wordline adjacent to the uppermost wordline that has previously programmed (S230). Then, memory controller 200 controls multi-bit memory device 100 to store the program data in the open block (S240). Operations S230 and S240 can be performed similar to the method of FIG. 4 or 5.

Figure 13:
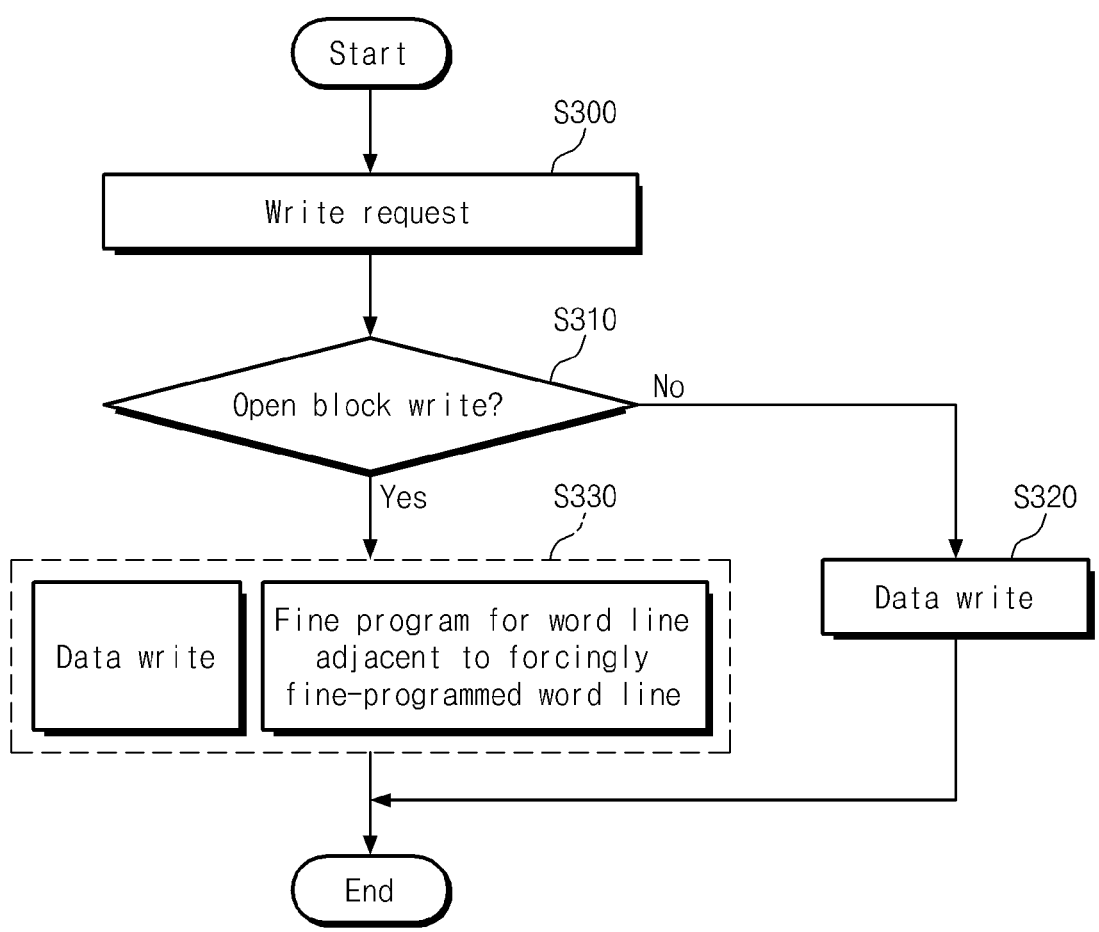

FIG. 13 is a flowchart illustrating a method of programming a memory system according to another embodiment of the inventive concept.

Referring to FIG. 13, host 300 requests a program operation from memory controller 200 (S300). Next, memory controller 200 determines whether the program operation requested by host 300 is an open block program operation (S310). Where the program operation requested by host 300 is determined not to be an open block program operation (S310=No), memory controller 200 controls multi-bit memory device 100 to store the program data in a memory block other than an open block (S320).

Where the program operation requested by host 300 is determined to be an open block program operation (S310=Yes), memory controller 200 controls multi-bit memory device 100 to perform a fine program operation (e.g., 2-bit fine program operation) on a wordline adjacent to a forcibly fine programmed wordline (S330). Before or after the fine program operation, the program data is written in the open block according to the program sequence. Operation S330 can be performed similar to the method of FIG. 6 or 7.

Figure 14:
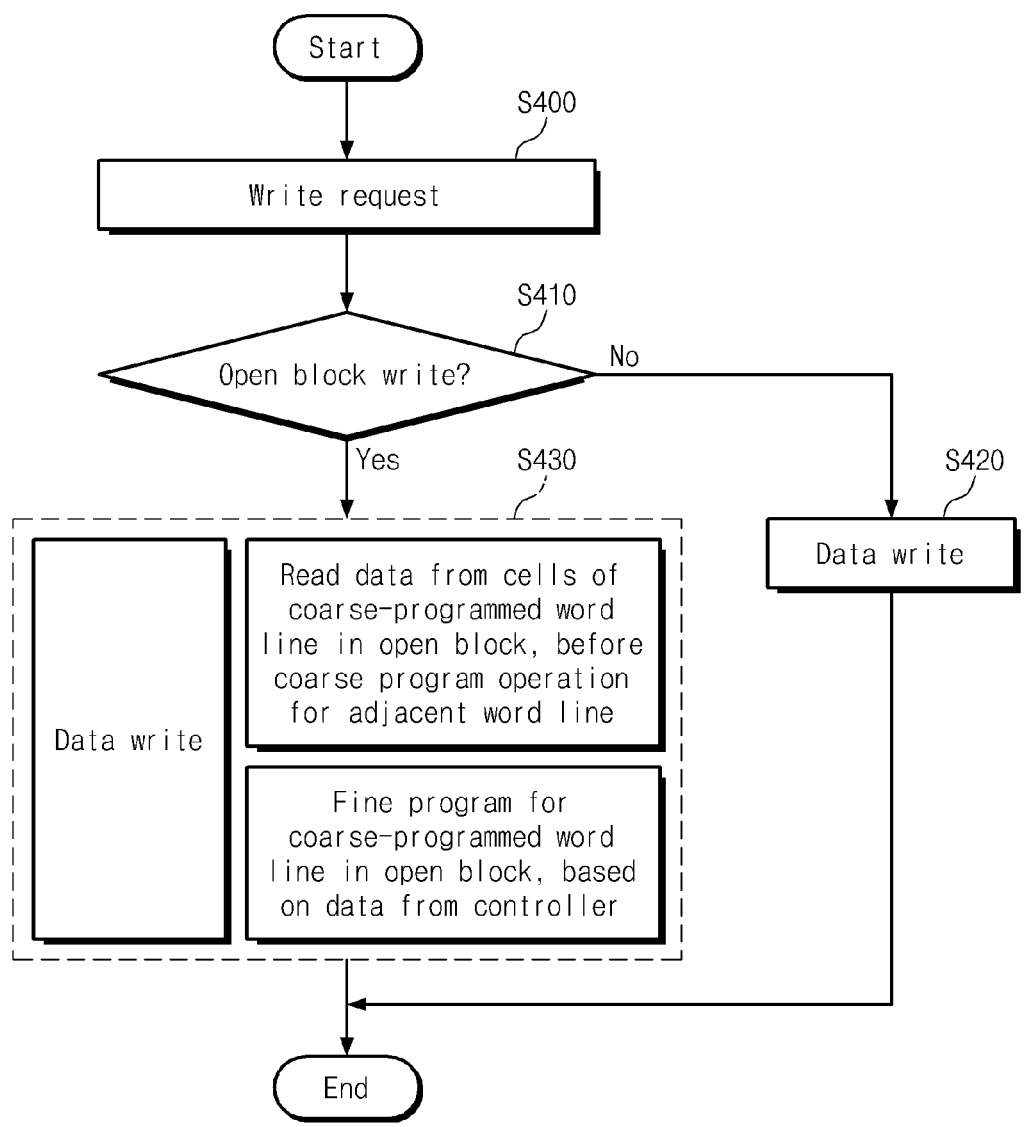

FIG. 14 is a flowchart illustrating a method of programming a memory system according to an embodiment of the inventive concept.

Referring to FIG. 14, host 300 requests a program operation from memory controller 200 (S400). Next, memory controller 200 determines whether the program operation requested by host 300 is an open block program operation (S410). Where the program operation requested by host 300 is determined not to be an open block program operation (S410=No), memory controller 200 controls multi-bit memory device 100 to store the program data in a memory block other than an open block (S420).

Where the program operation requested by host 300 is an open block program operation (S410=Yes), memory controller 200 controls multi-bit memory device 100 to read data from memory cells of a coarse-programmed wordline in an open block before a coarse program operation on a wordline adjacent to the coarse-programmed wordline in the open block (S430). Errors in the read data can be corrected by ECC unit 220 of memory controller 200. The corrected data is stored in buffer memory 210 of memory controller 200. The corrected data stored in buffer memory 210 is loaded to multi-bit memory device 100 when a fine program operation on the coarse-programmed wordline is determined according to the program sequence. The fine program operation on the coarse-programmed wordline is performed based on the loaded data. Program data is stored in the open block before the read operation, between the read operation and the data load operation, or after the data load operation, according to the program sequence. Operation 5430 can be performed similar to the method of FIG. 8 or 10.

Figure 15:
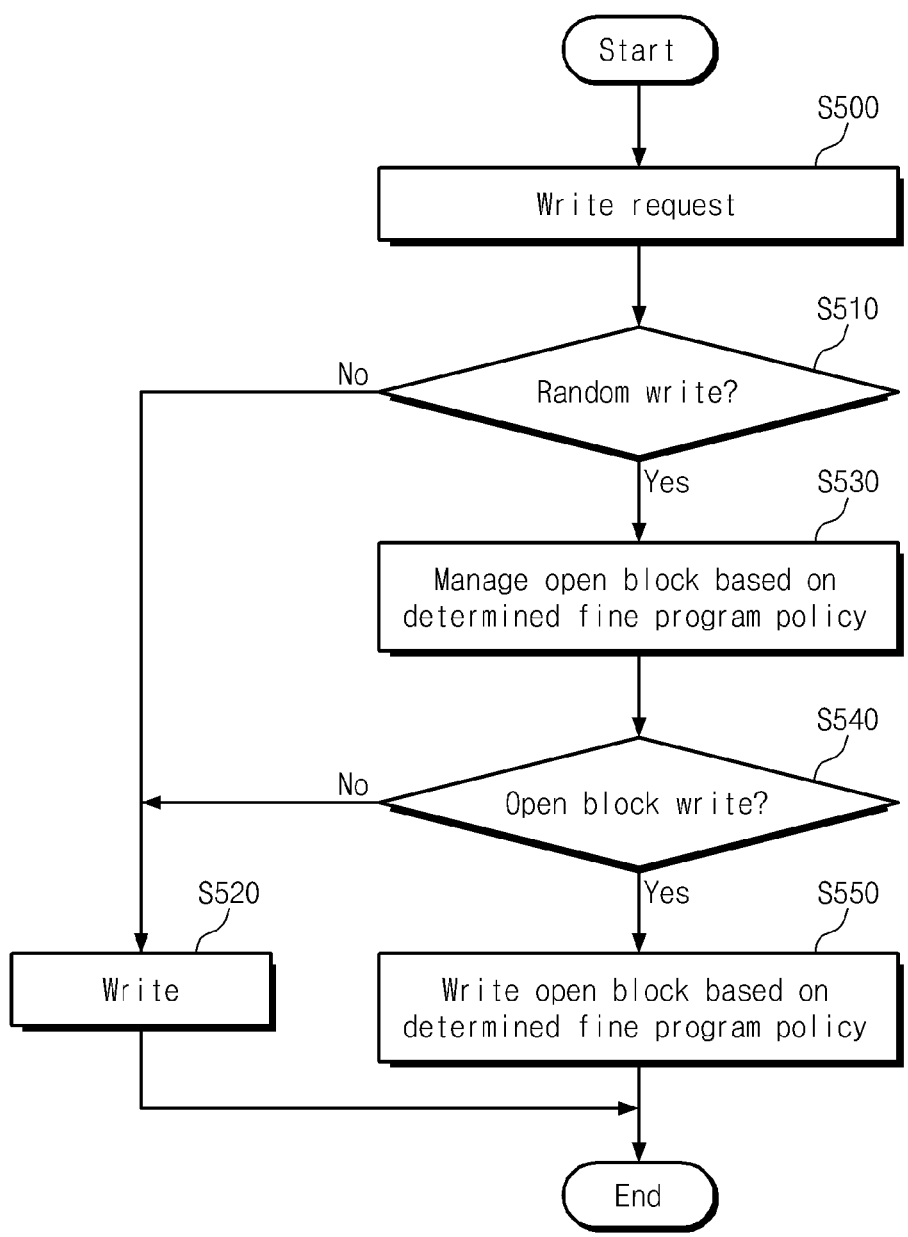
FIG. 15 is a flowchart illustrating a method of managing open blocks in a memory system according to an embodiment of the inventive concept.

FIG. 15 is a flowchart illustrating a method of operating a memory system according to an embodiment of the inventive concept.

Referring to FIG. 15, host 300 sends a request for a program operation to memory controller 200 (S500). Memory controller 200 then determines whether the requested program operation is a random program operation (S510). Where the requested program operation is not a random program operation (S510=No), memory controller 200 controls multi-bit memory device 100 to store program data in an open block (S520). Otherwise (S510=Yes), memory controller 200 manages the open block using a fine program policy (e.g., a fine program close or open policy) (S530). The management of the open block can be performed using a method such as those described in FIGS. 4 and 5. Operation S530 may be selectively performed. For example, where memory controller 200 operates according to the fine program open policy and the memory block having experienced a previous program operation is not an open block, operation S530 is omitted.

After operation S530, memory controller 200 determines whether the program operation requested by host 300 is an open block program operation (S540). Where the program operation requested by host 300 is determined not to be an open block (S540=No), the method proceeds to operation S520, where memory controller 200 controls multi-bit memory device 100 to store the program data in a memory block other than the open block.

Where the program operation requested by the host is determined to be an open program operation (S540=Yes), memory controller 200 controls multi-bit memory device 100 to store the program data in an open block according to a determined fine program (e.g., fine program close or open policy) (S550). Operation S550 can be performed according to one of the open block managing methods of FIGS. 4 through 10.

In various embodiments, memory controller 200 is configured to operate according to one of the above-described fine program policies. However, memory controller 200 can also be configured to use more than one of the fine program policies. For instance, memory controller 200 can be configured such that certain regions (e.g., main region, spare region, and meta region) of multi-bit memory device 100 are independently managed using different fine program policies.

In some embodiments, multi-bit memory device 100 comprises variable resistance memory cells. Examples of variable resistance memory cells are disclosed in U.S. Pat. No. 7,529,124, the disclosure of which is hereby incorporated by reference in its entirety.

In some embodiments, multi-bit memory device 100 comprises memory cells that store data using a charge trap layer. Examples of cell structures having a charge trap layer include a charge trap flash structure, a stack flash structure with multi-layered arrays, a source-drain free flash structure, and a pin-type flash structure. Various memory devices that store data using having a charge trap flash structure as a charge storage layer are disclosed in U.S. Pat. No. 6,858,906, U.S. Patent Publication No. 2004-0169238, and U.S. Patent Publication No. 2006-0180851, the respective disclosures of which are contents of which are hereby incorporated by reference in their entirety. Examples of flash structures without a source-drain are disclosed in Korean Patent No. 673,020, the disclosure of which is hereby incorporated by reference in its entirety.

The devices and systems described above can be mounted in packages of various types. For example, certain flash memory devices and memory controllers can be mounted in packages or package types such as package on package (PoP), ball grid arrays (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

As indicated by the foregoing, in certain embodiments of the inventive concept, the reliability of coarse-programmed memory cells is improved by programming open blocks based on various fine programming policies. The reliability of the coarse-programmed memory cells can be further improved by managing program operations to reduce the effects of coupling with adjacent memory cells.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a memory system comprising a multi-bit memory device, comprising:

determining whether a requested program operation in connection with a first memory block is a random program operation;

where the requested program operation is determined to be a random program operation, determining whether a selected memory block of a current program operation is an open block, and upon determining that the selected memory block is an open block, performing a fine program operation on coarse-programmed memory cells in the selected memory block before performing the random program operation in the first memory block;

determining whether the requested program operation is an open block program operation; and where the requested program operation is determined to be an open block program operation, storing program data of the open block program operation in the selected memory block.

2. The method of claim 1, further comprising: upon determining that the selected memory block is not an open block, performing the random program operation without first performing a fine program operation on the selected memory block.

3. The method of claim 1, wherein storing the program data of the open block program operation comprises: skipping a program operation on a first wordline adjacent to a previously programmed second wordline in the selected memory block; and storing the program data in memory cells connected to a third wordline adjacent to the first wordline.

4. The method of claim 1, wherein storing the program data of the open block program operation comprises: performing a fine program operation on a wordline adjacent to a forcibly fine-programmed wordline in the selected memory; and storing the program data in the selected memory block according to a predetermined program sequence.

5. The method of claim 4, wherein the program data is stored in the selected memory block before the fine program operation is performed on the wordline adjacent to the forcibly fine-programmed wordline.

6. The method of claim 4, wherein the fine program operation on the wordline adjacent to the forcibly fine-programmed wordline is performed on un-programmed memory cells.

7. The method of claim 1, further comprising, where the requested program operation is determined not to be a random program operation or an open block program operation, storing program data in a memory block of the multi-bit memory device according to the requested program operation.

* * * * *